United States Patent [19]
Goto et al.

[11] Patent Number: 6,111,513
[45] Date of Patent: Aug. 29, 2000

[54] APPARATUS FOR DETECTING OPEN CIRCUITS IN PARALLEL-WIRED THERMO MODULES

[75] Inventors: Hiroyasu Goto; Hiroyuki Sakama, both of Tsukuba-gun, Japan

[73] Assignee: SMC Corporation, Tokyo, Japan

[21] Appl. No.: 09/203,490

[22] Filed: Dec. 2, 1998

[30] Foreign Application Priority Data

Dec. 22, 1997 [JP] Japan ................................. 9-365666

[51] Int. Cl.⁷ ................................................. G08B 17/10
[52] U.S. Cl. ........................ 340/652; 340/640; 340/660; 257/712
[58] Field of Search ................................. 340/635, 640, 340/652, 654, 655, 660, 661, 584, 587, 588, 589; 62/37; 236/88, 91 R, 91 F, 91 G; 257/712, 720, 743

[56] References Cited

U.S. PATENT DOCUMENTS

| | | | |
|---|---|---|---|
| 4,519,850 | 5/1985 | Weiss | 117/40 |
| 4,610,142 | 9/1986 | Davis | 62/3.7 |
| 5,491,362 | 2/1996 | Hamzehdoost et al. | 257/712 |
| 5,687,474 | 11/1997 | Hamzehdoost et al. | 29/832 |

FOREIGN PATENT DOCUMENTS 1 465 365  2/1977  United Kingdom .

*Primary Examiner*—Jeffery A. Hofsass
*Assistant Examiner*—Van T. Trieu
*Attorney, Agent, or Firm*—Oblon, Spivak, McClelland, Maier & Neustadt, P.C.

[57] ABSTRACT

The present invention provides open-circuit detection for detecting an open circuit in parallel-connected thermo modules. Plural rows 10a of plural series-connected thermo modules 11a, ... 11n are connected in parallel. A detection circuit 12 is provided for each row 10a of modules to detect a change in voltage between a power terminal 17a and an intermediate terminal 18 caused by an open circuit. Switching circuits 20 in the detection circuits 12 are connected in series to an alarm circuit 14, so that if any detection circuit 12 detects an open circuit to preclude the corresponding switching element 20 from conducting, the alarm circuit 14 is activated to cause an alarm 32 to issue an alarm.

9 Claims, 2 Drawing Sheets

APPARATUS FOR DETECTING OPEN CIRCUITS IN PARALLEL-WIRED THERMO MODULES

FIELD OF THE INVENTION

The present invention relates to an open-circuit detection apparatus for detecting an open circuit in the heating or cooling thermo modules used in a heat treatment apparatus, which are used to heat or cool a work such as a semiconductor wafer, and in particular, to an apparatus for detecting an open circuit in parallel-wired thermo modules.

PRIOR ART

In a process for fabricating, for example, a semiconductor wafer, a cooling apparatus using thermo modules such as that shown in FIG. 3 is used for a heat treatment process to cool a hot (i.e., 90° to 200° C.) wafer. In this cooling apparatus, a plurality of thermo modules 1 each consisting of a Peltier element are installed between a cooling plate 2 and a radiating plate 3, and a wafer W is supported on the cooling plate 2 in such a way that a specified gap is maintained between the wafer and the cooling plate by spacers 4. The wafer W is cooled to a desired temperature (23° to 25° C.) by the thermo modules 1 via the cooling plate 2, the modules being thermally controlled by a temperature controller 5.

In such a cooling apparatus, the thermo modules 1 are generally connected in series. An open circuit in the thermo modules 1 is detected by a sensor 6 that measures the temperature of the cooling plate 2. That is, when the plurality of thermo modules 1 are connected in series and if an open circuit occurs in any of them, all thermo modules 1 will be turned off to change the temperature of the cooling plate 2. Thus, the open circuit can be determined by measuring the temperature of the cooling plate 2.

If additional thermo modules are installed to improve the apparatus' cooling capability, conventional series connections require the applied voltage to be increased correspondingly, thereby requiring the control apparatus to assume a complex configuration and potentially affecting its safety. Thus, it is contemplated that plural rows of series-connected modules could be connected together in parallel. If, however, plural rows of modules are connected together in parallel, an open circuit cannot be detected easily based on temperature. That is, should an open circuit occur in any thermo module in any row, the thermo modules in the other rows of modules would still be active. Consequently, while the temperature of the cooling plate increases locally, near the open-circuited thermo module, in such cases, the temperature of the remaining areas does not change significantly. As a result, when the temperature sensor measures the temperature of the cooling plate, if the measured point is located away from the open-circuited thermo module, it becomes almost impossible to detect the open circuit.

DISCLOSURE OF THE INVENTION

It is a main object of this invention to provide an open-circuit detection apparatus that can reliably detect an open circuit in parallel-connected thermo modules.

It is another object of this invention to use a change in terminal voltage caused by an open circuit in order to detect an open circuit in the parallel-connected thermo modules, regardless of the location of the open circuit.

To achieve this object, this invention provides an open-circuit detection apparatus comprising a group of thermo modules including plural rows of plural series-connected thermo modules, the rows being connected together in parallel; detection circuits provided for each row of modules and connected between an intermediate terminal provided in the middle of the row and a power terminal provided at each end of the row; and an alarm circuit common to each detection circuit and activated to output an alarm when one of the detection circuits detects a change in voltage.

In the present open-circuit detection apparatus of this configuration, if an open circuit occurs in any row of modules between the intermediate terminal and the positive-side power terminal, the terminal voltage of the detection circuit connected to this row increases. If an open circuit occurs between the intermediate terminal and the negative-side power terminal, the terminal voltage of the detection circuit becomes zero, creating a detectable change in voltage and activating the alarm circuit to issue an alarm. Thus, any change in terminal voltage can be used to detect an open circuit simply and reliably.

According to a specific configuration mode, each detection circuit includes a switching element that conducts current when power is turned on, a first control element that controls the switching element, and a second control element that detects a change in voltage between the power and intermediate terminals caused by an open circuit in order to activate the first control circuit. The alarm circuit includes a third control element that activates an alarm generating means and a fourth control element that controls the third control element. The switching elements in the detection circuits are connected together in series and further connected to the fourth element in the alarm circuit. Thus, if any switching element is opened, the fourth control element is activated to operate the third control element, thereby operating the alarm generating means.

The alarm circuit desirably has a delay circuit for delaying the activation of the third control circuit so that an alarm is issued if an open circuit has been continuously detected by the detection circuit over a specified period of time.

According to a preferred embodiment of this invention, a diode bridge is incorporated between the power and intermediate terminals to absorb a change in the polarity of the applied voltage, in order to deal with the inversion of the polarities of DC voltages applied to the power terminals.

According to this invention, the detection circuit and the alarm circuit can be connected together via a thermostat to detect an open circuit based on a change in temperature.

According to another preferred embodiment, a malfunction prevention circuit is provided that is operative if the thermo modules are turned on and off by a signal such as pulse signal; it receives this control signal and when the signal indicates an off state, disables the alarm circuit immediately by synchronizing with the signal.

DETAILED DESCRIPTION

Figure 1:
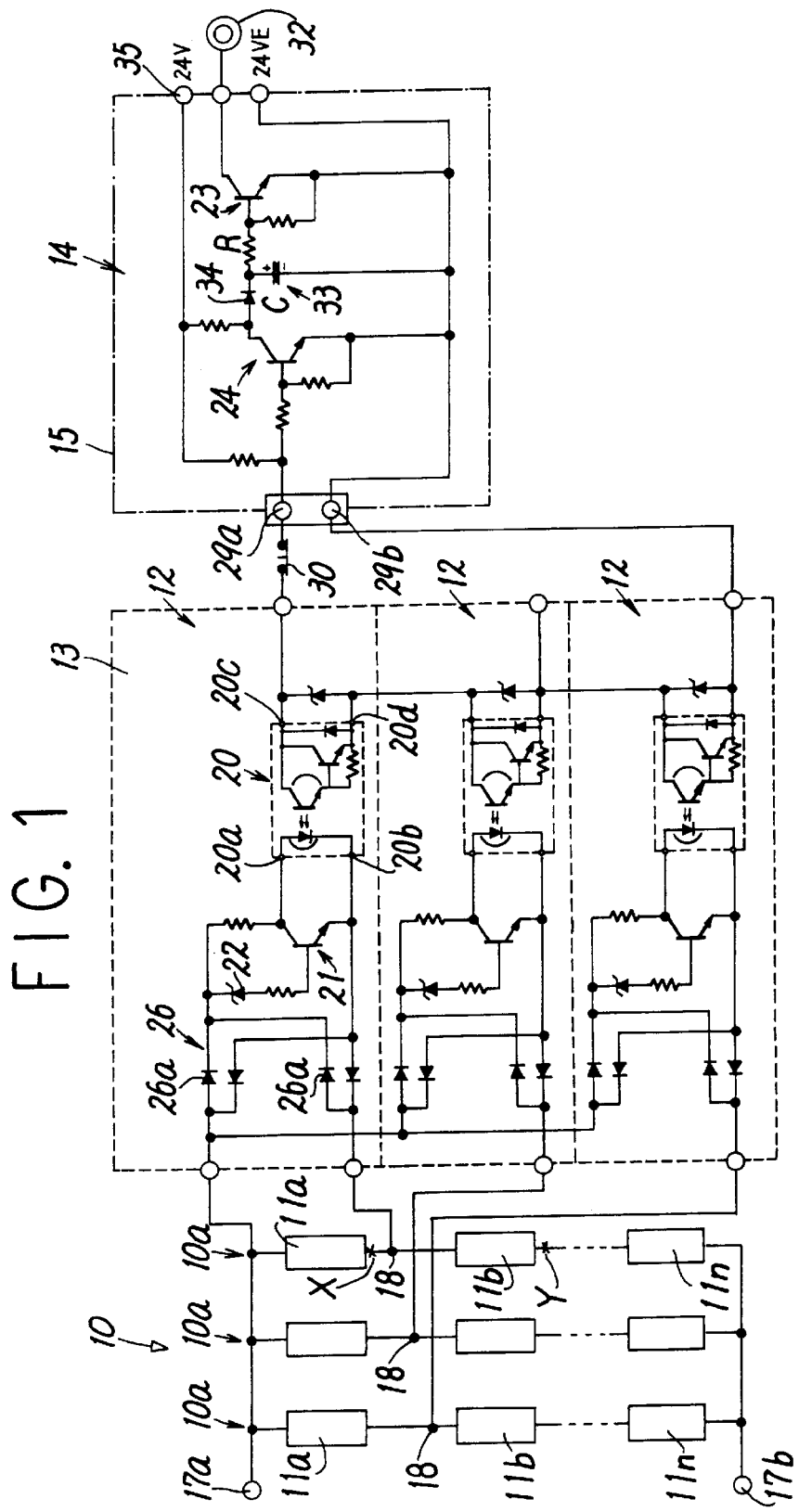
FIG. 1 is a circuit diagram showing a first embodiment of an open-circuit detection apparatus according to this invention.
Figure 3:
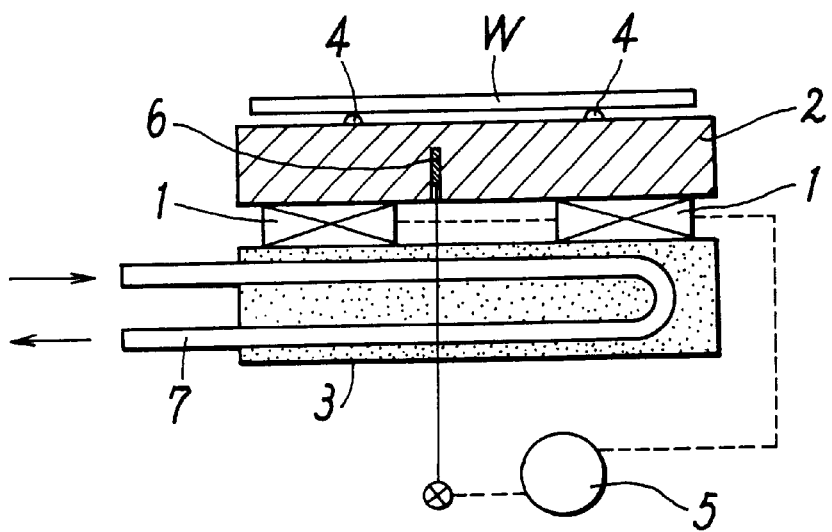
FIG. 3 is a sectional view showing an example of a heat treatment apparatus using thermo modules.

FIG. 1 shows a first embodiment of an open-circuit detection apparatus according to this invention. Reference numeral 10 designates a group of thermo modules used for a heat treatment apparatus such as that shown in FIG. 3, 12 is a detection circuit for detecting an open circuit in a thermo module 11 in the group 10 of thermo modules; 13 is a detection circuit board incorporating the detection circuit 12; 14 is an alarm circuit for generating an alarm when an open circuit in a thermo module 11 is detected; and 15 is an alarm circuit board incorporating the alarm circuit 14.

The group 10 of thermo modules comprises a plurality of thermo modules 11a, 11b, . . . 11n (hereafter simply represented as reference numeral "11" unless a particular module is specified) each consisting of a Peltier element that generates or absorbs heat when power is turned on, and connected together in series as a row 10a of modules. Plural rows 10a of modules are connected in parallel between a first and a second power terminals 17a and 17b for conduction. Each of the thermo modules 11 in the group 10 of thermo modules is installed between the cooling plate 2 and the radiating plate 3 in a heat treatment apparatus as show n in FIG. 3.

Each row 10a of modules has an intermediate terminal 18 formed between the thermo module 11a in the first stage and the thermo module 11b in the second stage. The detection circuit 12 for detecting a change in voltage between the intermediate terminal 18 and the first power terminal 17a caused by an open circuit is connected between the intermediate module 18 and the first power terminal 17a on the positive side in parallel with the thermo module 11a in the first stage.

Each detection circuit 12 comprises a switching element 20 consisting of a photo coupler, a first control element 21 consisting of a transistor for controlling the switching element 20, and a second control element 22 consisting of a Zener diode to detect a change in voltage between the first power terminal 17a and the intermediate terminal 18 caused by an open circuit in order to active the first control element 21. The collector and emitter of the first control element 21 are connected between the first power terminal 17a and the intermediate terminal 18, the second control terminal 22 is connected between the base of the first control element 21 and the first power terminal 17a, and input terminals 20a and 20b of the switching element 20 are connected between the collector of the first control element 21 and the intermediate terminal 18.

In addition, a diode bridge 26 comprising four diodes 26a connected together in a bridge is incorporated between the first power terminal 17a and the intermediate terminal 18 to deal with the inversion of the polarities of DC voltages applied to the two power terminals 17a and 17b.

The detection circuit 12 is individually provided for each row 10a of modules, and output terminals 20c and 20d of each of the switching elements 20 in all detection circuits 12 are connected in series between two input terminals 29a and 29b of the alarm circuit 15 via a thermostat 30. In a normal state in which no row 10a of modules is open-circuited, each switching element 20 is turned on by conduction and all of the output terminals 20c and 20d conduct current.

If an open circuit occurs in any row 10a of modules at a point X closer to the first power terminal 17a than the intermediate terminal 18, the corresponding detection circuit 12 and the thermo modules 11b, . . . 11n in the second and subsequent stages are connected in series between the power terminals 17a and 17b. In this case, the resistance of the detection circuit 12 is larger than the internal resistance of the thermo module 11, so the terminal voltage of the detection circuit 12 (i.e., the terminal voltage between the first power terminal 17a and the intermediate terminal 18) rises close to the voltage applied to the power terminals 17a and 17b. Consequently, the second control element 22 is activated to operate the first control element 21 to allow conduction between the collector and emitter, thereby turning the switching element 20 off to prevent the output terminals 20c and 20d from conducting.

In addition, if an open circuit occurs in the row 10a of modules at a point Y between the intermediate terminal 18 and the second power terminal 17b, the detection circuit 12 is disconnected from the power terminal 17b to reduce to zero the terminal voltage between the first power terminal 17a and the intermediate terminal 18, thereby turning the switching element 20 off to prevent the output terminals 20c and 20d from conducting.

The alarm circuit 14 comprises a third control element 23 for activating an alarm generating means 32 such as a buzzer or a light, and a fourth control element 24 for controlling the third control element 23. The control elements 23 and 24 each consist of a transistor, and the alarm generating means 32 is connected to a collector-emitter circuit in the third control element 23. A bias power supply 35 and the collector of the fourth control element 24 are connected to the base of the third control element 23 via a delay circuit 33 and a diode 34, and the bias power supply 35 and the row of switching elements 20 are connected to the base of the fourth control element 24.

The alarm generating means 32 issues an alarm when an alarm current flowing through a collector-emitter circuit in the third control element 23 is shut off.

In addition, the delay circuit 33 delays the activation of the third control element 23 by a specified time (about 0.1 second) after the activation of the fourth control element 24, and is composed of a resistor R and a capacitor C. The delay circuit 33 is provided to activate the alarm circuit 14 only if an open circuit has been continuously detected by the detection circuit 12 over a specified period of time, thereby preventing an alarm from being mistakenly issued due to noise.

In the alarm circuit 14, in a normal state in which no rows 10a of modules are open-circuited, the base of the fourth control element 24 is grounded through the rows of switching elements 20, so the fourth control element 24 is inactive while the third control element 23 is conducting due to a bias current flowing from the bias power supply 35 to the base. Consequently, an alarm current is flowing through the third control element 23. Thus, in this state, the alarm generating means 32 is prevented from issuing an alarm.

If any row 10a of modules is open-circuited to open the switching element 20 of the detection circuit 12, a base current flows through the fourth control element 24, which then conducts to reduce the collector voltage, thereby eliminating the supply of a current in the forward direction from the fourth control element 24 to the diode 34. As a result, the capacitor C of the delay circuit 33 starts to discharge via the resistor R, and once a set delay time has passed and this discharge is complete, the third control element 23 is turned off to shut off the alarm current, thereby causing the alarm generating means 32 to issue an alarm.

The thermostat 30 connected between the switching element 20 of the detection circuit 12 and the input terminal 29a of the alarm circuit 14 is opened upon detecting an abnormal temperature in the cooling plate in the heat treatment apparatus, and is adapted to issue a common alarm depending on the temperature.

Although the illustrated embodiment provides an intermediate terminal 18 between the thermo module 11a in the first stage and the thermo module 11b in the second stage, the position of the intermediate terminal 18 is not limited in this regard. For example, the intermediate terminal 18 may be provided between the thermo module 11n-1 in the n-1-th stage and the thermo module 11n in the n-th stage, so that an open circuit can be detected between the intermediate terminal 18 and the second power terminal 17b.

Figure 2:
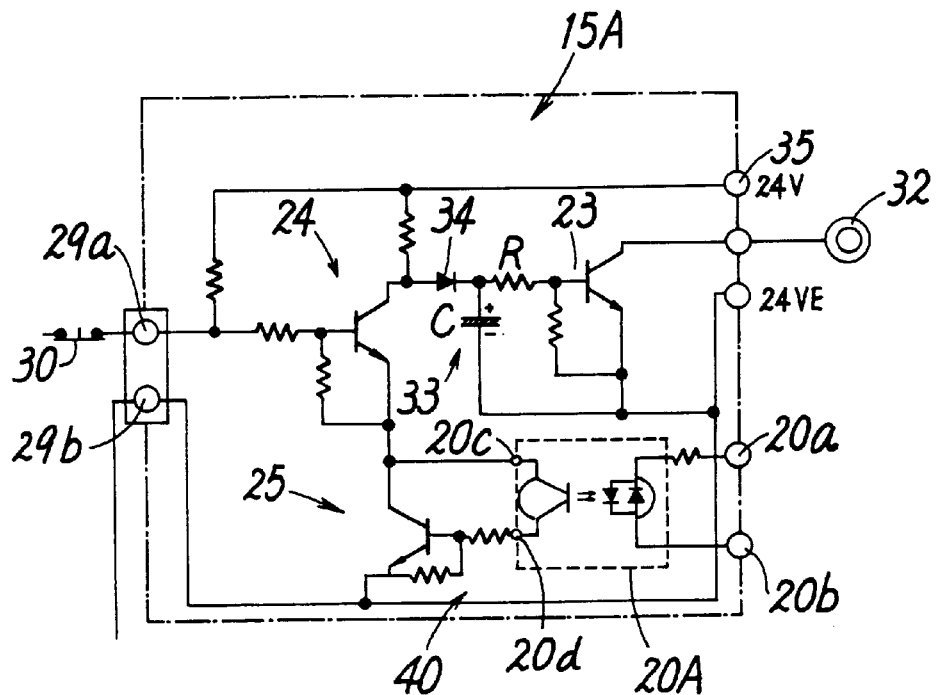
FIG. 2 is a circuit diagram of an alarm circuit according to a second embodiment of this invention.

FIG. 2 shows an alarm circuit 14A according to a second embodiment of this invention. In contrast to the alarm circuit 14 according to the first embodiment, which is suitable for control of the thermo module 11 by means of continuous conduction, the alarm circuit 14A according to the second embodiment is suitable for Pulse Width Modulation (PWM) control of the thermo module 11 and for variable control of the applied voltage.

That is, the alarm circuit 14A differs from the alarm circuit 14 according to the first embodiment in that it includes a malfunction prevention circuit 40 for receiving a pulse signal that turns the thermo module 11 on and off; and when this signal indicates an off state, for disabling the alarm circuit 14 by synchronizing with the signal.

The malfunction prevention circuit 40 is composed of a fifth control element 25 connected to an emitter ground circuit in the fourth control circuit 24 and a switching element 20A connected between the base and collector of the fifth control element 25. A pulse signal is input to the input terminals 20a and 20b of the switching element 20A. The fifth control element 25 is a transistor, and the switching element 20A is a photo coupler.

While the pulse signal is being input to the input terminals 20a and 20b of the switching element 20A, that is, while the thermo module 11 is conducting, the output terminals 20c and 20d of the switching element 20A and thus the fifth control element 25 also conduct, thereby allowing the emitter-ground circuit in the fourth control element 24 to conduct to enable the detection circuit 12 to detect an open circuit. On the other hand, while a pulse signal is not being input to the input terminals 20a and 20b of the switching element 20A, that is, while the thermo module 11 is not conducting, the output terminals 20c and 20d of the switching element 20 are shut off to preclude the fifth control element 25 from conducting, thereby blocking the emitter-ground circuit in the fourth control element 24 to prevent the third control element 23 from operating. Thus, in this state, each detection circuit 12 operates as if an open circuit occurred at the point Y in the row 10a of modules, but this detection is invalid.

The other configuration and operation of the second embodiment are substantially the same as those of the first embodiment.

As described above, the detection apparatus according to this invention is able to employ changes in terminal voltage to detect an open circuit in parallel-connected thermo modules both simply and reliably, regardless of the location of the open circuit.

What is claimed is:

1. An apparatus for detecting an open circuit in parallel-wired thermo modules characterized in that the apparatus comprises:

a group of thermo modules including plural rows of plural series-connected thermo modules each generating or absorbing heat due to conduction, the plural rows of modules being connected together in parallel between a first and a second power terminals for conduction;

detection circuits provided for each row of modules and connected between an intermediate terminal provided in the middle of the row and one of the power terminals to detect a change in voltage between the power and intermediate terminals caused by an open circuit; and an alarm circuit common to each row of modules and activated to output an alarm when one of said detection circuits detects a change in voltage.

2. A detection apparatus according to claim 1 wherein:

each of said detection circuits includes a switching element that conducts when power is turned on, a first control element that controls the switching element, and a second control element that detects a change in voltage between said power and intermediate terminals caused by an open circuit, in order to activate the first control element, wherein:

said alarm circuit includes a third control element that activates an alarm generating means and a fourth control element that controls the third control element, and wherein:

the switching elements in said detection circuits are connected together in series and further connected to the fourth control element in the alarm circuit so that if any switching element is opened, the fourth control element is activated to operate the third control element, thereby operating the alarm generating means.

3. A detection apparatus according to claim 2 wherein said alarm circuit includes a delay circuit for delaying the activation of the third control element by a specified period of time after the activation of the fourth control element.

4. A detection apparatus according to claim 1 wherein a diode bridge is incorporated between said power and intermediate terminals to absorb a change in the polarity of the applied voltage.

5. A detection apparatus according to claim 2 wherein said switching element is a photo coupler, wherein the first, third, and fourth control elements are transistors, and wherein the second control element is a Zener diode.

6. A detection apparatus according to claim 2 wherein a thermostat that is opened upon detecting a change in temperature is connected between the fourth control element and a row of switching elements comprising the switching elements in said detection circuits connected together in series.

7. A detection apparatus according to any of claims 1 to 6 including a malfunction prevention circuit for receiving a control signal that turns said thermo module on and off, and when the signal indicates an off state, disabling said alarm circuit by synchronizing with the signal.

8. A detection apparatus according to claim 7 wherein said malfunction prevention circuit includes a fifth control element connected to open and close part of the alarm circuit, and a switching element connected to the fifth control element such that during the input of said control signal, the switching element conducts to keep the fifth control element conducting, whereas while the control signal is not input, the switching element does not conduct to prevent the fifth control element from conducting.

9. A detection apparatus according to claim 8 wherein said fifth control element is a transistor and wherein the switching element is a photo coupler.

* * * * *